US012707659B2

(12) United States Patent
Peng et al.

(10) Patent No.: US 12,707,659 B2
(45) Date of Patent: Aug. 11, 2026

(54) SEMICONDUCTOR STRUCTURE AND METHOD FOR MANUFACTURING SEMICONDUCTOR STRUCTURE

(71) Applicant: HUNAN SAN'AN SEMICONDUCTOR CO., LTD., Changsha (CN)

(72) Inventors: Zhigao Peng, Changsha (CN); Yonghong Tao, Changsha (CN)

(73) Assignee: HUNAN SAN'AN SEMICONDUCTOR CO., LTD., Changsha (CN)

( * ) Notice: Subject to any disclaimer, the term of this patent is extended or adjusted under 35 U.S.C. 154(b) by 341 days.

(21) Appl. No.: 18/241,323

(22) Filed: Sep. 1, 2023

(65) Prior Publication Data

US 2024/0162327 A1 May 16, 2024

(30) Foreign Application Priority Data

Nov. 11, 2022 (CN) ......................... 202211408804.6

(51) Int. Cl.
*H10D 8/60* (2025.01)
*H10D 8/01* (2025.01)
*H10D 64/64* (2025.01)

(52) U.S. Cl.
CPC ............... *H10D 8/051* (2025.01); *H10D 8/60* (2025.01); *H10D 64/64* (2025.01)

(58) Field of Classification Search
CPC .......... H10D 8/051; H10D 8/60; H10D 64/64; H10D 62/8325
See application file for complete search history.

(56) References Cited

U.S. PATENT DOCUMENTS

| | | | |
|---|---|---|---|
| 6,344,680 | B1 | 2/2002 | Yamaguchi |
| 2006/0086939 | A1 | 4/2006 | Carta et al. |
| 2017/0186847 | A1 | 6/2017 | Hikasa et al. |

(Continued)

FOREIGN PATENT DOCUMENTS

| | | | |
|---|---|---|---|
| CN | 111584613 | A | 8/2020 |
| CN | 113257888 | A | 8/2021 |
| CN | 113451416 | A | 9/2021 |

(Continued)

OTHER PUBLICATIONS

Chinese First Office Action, Chinese Application No. 202211408804.6, mailed Feb. 7, 2023 (19 pages).

(Continued)

*Primary Examiner* — Douglas M Menz

(57) ABSTRACT

A semiconductor structure includes a substrate, a semiconductor epitaxial layer, an active region and a terminal region, a field oxide layer, an anode layer, and a passivation layer. The anode layer is configured to extend from the active region to be arranged on a portion of the field oxide layer. The side wall and the top wall of the anode layer are connected to each other through a curved connection surface. By setting the upper corner of the side wall of the anode layer to be curved, the transition between the side wall and the top wall of the anode layer is smooth, preventing a sharp change in the inclination angle and preventing the stress concentration of the passivation layer at the corner of the side wall.

20 Claims, 6 Drawing Sheets

(56) References Cited

U.S. PATENT DOCUMENTS

2022/0310822 A1 9/2022 Tao et al.
2023/0103655 A1* 4/2023 Nakano ................ H10D 62/127
257/773

FOREIGN PATENT DOCUMENTS

EP 3690957 A1 8/2020
JP H04275430 A 10/1992

OTHER PUBLICATIONS

European Search Report, European Application No. 23204550.0, mailed Mar. 28, 2024 (9 pages).

* cited by examiner

SEMICONDUCTOR STRUCTURE AND METHOD FOR MANUFACTURING SEMICONDUCTOR STRUCTURE

CROSS REFERENCE TO RELATED APPLICATIONS

The present application claims the priority of the Chinese patent application No. 202211408804.6, filed on Nov. 11, 2022, and contents of which are incorporated herein by its entireties.

TECHNICAL FIELD

The present disclosure relates to the field of semiconductors, and in particular to a semiconductor structure and a method of manufacturing a semiconductor structure.

BACKGROUND

Silicon carbide serves as an important third-generation semiconductor material and has a high forbidden bandwidth, a high critical breakdown electric field and a high thermal conductivity. Therefore, a silicon carbide power element has a higher breakdown voltage, a faster switching speed and a higher operating temperature, compared to a traditional silicon-based power element. As the silicon carbide diode technology develops and is increasingly mature, an application market is increasingly extensive, including photovoltaic inverters, vehicle-mounted chargers, communication power supplies, and so on.

Different application scenarios have different reliability requirements about the elements. For example, a coastal area may have a high temperature, high salt and high humidity environment, and may have special requirements for a H3TRB of the element, which is more stringent than a traditional silicon-based AEC-Q101 standard. Currently, a power element may include a laminated structure having silicon oxide and silicon nitride or include or a silicon oxynitride passivation layer to protect the power element against moisture. In the art, the passivation layer or a material layer may be cracked easily, resulting in failure of the element.

SUMMARY OF THE DISCLOSURE

The present disclosure aims to, for example, provide a semiconductor structure and a method of manufacturing a semiconductor structure, reducing the failure of the element caused by the passivation layer being cracked in the art.

The present disclosure is achieved as follows.

In a first aspect, a semiconductor structure is provided and includes: a substrate; a semiconductor epitaxial layer, disposed on the substrate; an active region and a terminal region, provided in the semiconductor epitaxial layer; a field oxide layer, arranged on the semiconductor epitaxial layer and extending from an edge of the active region towards the terminal region; an anode layer, configured to extend from the active region to be arranged on a portion of the field oxide layer, wherein the anode layer comprises: a top wall, away from the active region; a side wall, connected to the field oxide layer; and a connection surface, connected between the side wall of the anode layer and the top wall of the anode layer; the connection surface is curved, a transition between the side wall and the top wall of the anode layer is smooth; and a passivation layer, configured to cover the field oxide layer and extend along the side wall and to cover at least the connection surface.

In a second aspect, a method of manufacturing a semiconductor structure is provided and includes: providing a substrate structure, wherein the substrate structure comprises: a substrate; a semiconductor epitaxial layer, disposed on the substrate; an active region and a terminal region, disposed in the semiconductor epitaxial layer; and a field oxide layer, configured to extend from an edge of the active region towards the terminal region; forming an anode layer on the field oxide layer and the active region, wherein the anode layer is configured to be extending from the active region to cover a portion of the field oxide layer; the anode layer comprises: a top wall, away from the active region; a side wall, connected to the field oxide layer; and a connection surface, connecting between the side wall and the top wall of the anode layer; the connection surface is curved to allow the side wall to be transitioned smoothly to the top wall of the anode layer; and forming a passivation layer on the field oxide layer and the anode layer, wherein the passivation layer is configured to cover the field oxide layer and extends along the side wall to cover at least the connection surface.

BRIEF DESCRIPTION OF THE DRAWINGS

In order to illustrate the technical solutions of embodiments of the present disclosure more clearly, the accompanying drawings used for describing the embodiments will be briefly described in the following. It should be understood that the following accompanying drawings illustrate only some embodiments of the present disclosure and shall not be interpreted as limiting the scope of the present disclosure. Any ordinary skilled person in the art may obtain other relevant accompanying drawings based on these drawings without creative work.

Figure 1:
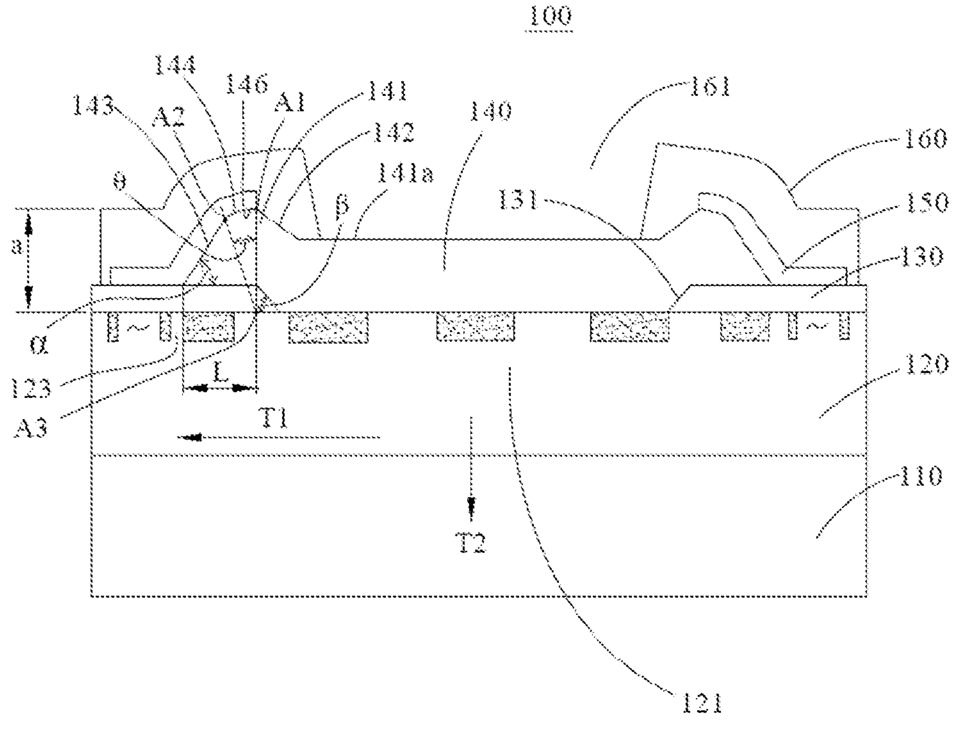
FIG. 1 is a schematic view of a semiconductor structure according to an embodiment of the present disclosure.

Reference numerals: 100—semiconductor structure; 110—substrate; 120—semiconductor epitaxial layer; 121—active region; 123—terminal region; 130—field oxide layer; 131—first window; 140—anode layer; 141—protrusion portion; 141*a*—recessed portion; 142—top wall; 143—side wall; 144—connection surface; 145—metal layer; 146—connection portion; 147—photoresist layer; 150—passivation layer; 160—protective layer; 161—second window.

DETAILED DESCRIPTION

In order to make the purpose, technical solutions and advantages of embodiments of the present disclosure clearer, the technical solutions in the embodiments of the present disclosure will be described clearly and completely by referring to the accompanying drawings in the embodiments of the present disclosure. Obviously, the described embodiments are a part of but not all of the embodiments of the present disclosure. Any assembly described and illustrated in the accompanying drawings of the embodiments of the present disclosure can be arranged and designed in various configurations.

Therefore, the following detailed description of the embodiments of the present disclosure provided in the accompanying drawings is not intended to limit the scope of the claims of the present disclosure, but merely indicates selected embodiments of the present disclosure. Based on the embodiments in the present disclosure, all other embodiments obtained without creative work by any ordinary skilled person in the art shall fall within the scope of the present disclosure.

It should be noted that similar reference numerals and letters indicate similar items in the accompanying drawings below. Therefore, once an item has been defined in one accompanying drawing, the item does not need to be further defined and explained in subsequent drawings.

In the description of the present disclosure, to be noted that, the terms “upper”, “lower”, “inner”, “outer”, and so on, are used to indicate an orientation or positional relationship based on the orientation or positional relationship shown in the accompanying drawings or indicate the orientation or positional relationship in which the product of the present disclosure is customarily placed for use. The terms are used to facilitate and simplify the description of the present disclosure and do not indicate or imply that the described devices or elements must have a particular orientation or must be constructed and operated in a particular orientation. Therefore, the terms shall not be interpreted as limiting the present disclosure.

Furthermore, the terms “first”, “second”, and so on, are used only to distinguish the description and shall not be understood as indicating or implying relative importance.

The present disclosure provides a novel semiconductor structure and a method of manufacturing the semiconductor structure. To be noted that features in the embodiments of the present disclosure can be combined with each other without conflict.

Currently, a power element may include a laminated structure having silicon oxide and silicon nitride or include or a silicon oxynitride passivation layer to protect the power element against moisture. However, in practice, the power element may be subjected to high and low temperature cycles. In the art, etching is only performed in a direction perpendicular to a surface of a silicon wafer, and a structure formed by the etching is usually a vertical chipping surface. Therefore, for a passivation layer or a material layer, a stress may be concentrated at a corner of the etched metal, leading to cracks of the passivation layer or the material layer. Moisture may enter through the cracks at an accelerated rate under an effect of a high electric field, leading to failure of the power element.

Figure 2:
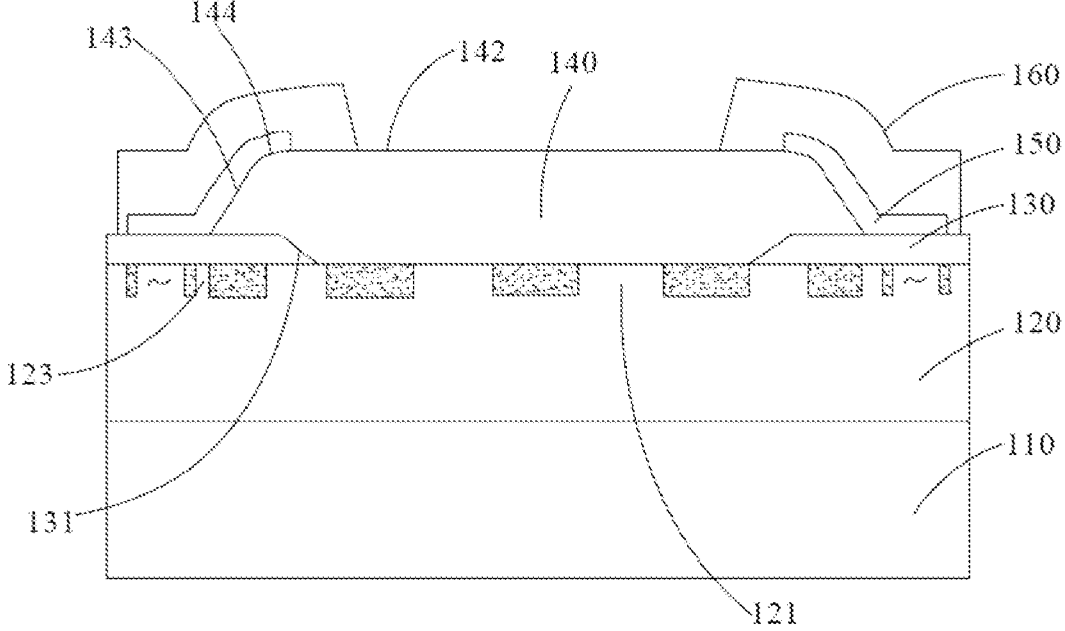
FIG. 2 is a schematic view of a semiconductor structure according to an embodiment of the present disclosure.

As shown in FIG. 1 or FIG. 2, the present embodiment provides a semiconductor structure 100. In the present embodiment, conditions for lithography and etching may be optimized, for example, conditions for lithography and dry etching are optimized, such that a corner of the anode layer 140 may be flatter, reducing the problem of cracks caused by stress concentration at the corner due to the anode layer 140 being steep and straight. Therefore, moisture resistance of the semiconductor structure may be improved.

The present embodiment provides a semiconductor structure 100, including a substrate 110, a semiconductor epitaxial layer 120, a field oxide layer 130, an anode layer 140, and a passivation layer 150. The semiconductor epitaxial layer 120 is arranged on the substrate 110 and is arranged with an active region 121 and a terminal region 123. The active region 121 and the terminal region 123 are extending from an inside the semiconductor epitaxial layer 120 away from a surface (top surface) of the substrate 110. The field oxide layer 130 is arranged on the semiconductor epitaxial layer 120. The field oxide layer 130 is configured to extend from an edge of the active region 121 towards the terminal region 123. The anode layer 140 is configured to extend from the active region 121 to be arranged on a part of the field oxide layer 130. That is, the anode layer 140 is arranged on the field oxide layer 130 and covers a part of the field oxide layer 130. The anode layer 140 includes: a top wall 142 away from the active region 121 and a side wall 143 facing towards and connected to the field oxide layer 130. The side wall 143 of the anode layer 140 is connected to the top wall 142 of the anode layer 140 by a connection surface 144. The connection surface 144 is curved to enable the side wall to be smoothly transitioned to the top wall of the anode layer. The passivation layer 150 is configured to cover a part of the field oxide layer 130 and extends to cover the connection surface 144. In more detail, the transition portion, which is extending from the side wall to the top wall, does not have any sharp corner, i.e., the corner has no sharp tip. For example, the transition portion may be a round corner. It is understood that, the present disclosure dose not require a specific shape of the transition portion, as long as no sharp corner or sharp tip is formed.

To be noted that, the power element is often subject to high and low temperature cycles in practice, and an thermal expansion coefficient of the passivation layer, an thermal expansion coefficient of the anode layer, and an thermal expansion coefficient of the protective layer are different from each other. Therefore, the passivation layer may be cracked when an excessive shear force is applied. Especially, the stress may be concentrated at a portion of the passivation layer located at the corner of the anode layer, and therefore, the corner of the anode layer may be cracked. In addition, the moisture may enter an inside of the power element through the cracks in an accelerated rate under an action of the high electric field, leading to the failure of the power element.

In the present embodiment, by arranging a curved connection surface 144 between the side wall and the top wall 142 of the anode layer 140, the transition between the side wall 143 and the top wall 142 of the anode layer 140 may be smooth. In this way, a sharp change in an angle between the side wall 143 and the top wall 142 of the anode layer 140 may be reduced, such that the stress concentration at a part of the passivation layer above the corner may be reduced, and the moisture entering the power element, which may cause the failure, may be reduced.

Furthermore, since the passivation layer is configured to cover the field oxide layer 130 and to extend to cover the connection surface 144, coverage of the passivation layer 150 over the anode layer 140 may be standardized, and cracks caused by thermal expansion may be reduced, further enhancing the moisture resistance of the power element.

In addition, compared to the related art where a power element may include a laminated structure having silicon oxide and/or silicon nitride or include or a silicon oxynitride passivation layer to protect the power element against moisture, in the present disclosure, only the corner structure of the anode layer is modified, and a buffering material layer may not be arranged. Therefore, in the present disclosure, the stress concentration of the passivation layer may be reduced, while an interlayer structure of the power element may be reduced, such that a package height of the power element may be reduced. Therefore, the power element may be miniaturized.

Furthermore, since the transition between the side wall 143 and the top wall 142 is smooth, the passivation layer 150 may be enabled to extend upwards when being deposited, such that a climbing problem of the passivation layer 150 above the anode layer 140 may be solved, the passivation layer 150 may be formed better, improving the reliability of the power element.

Figure 3:
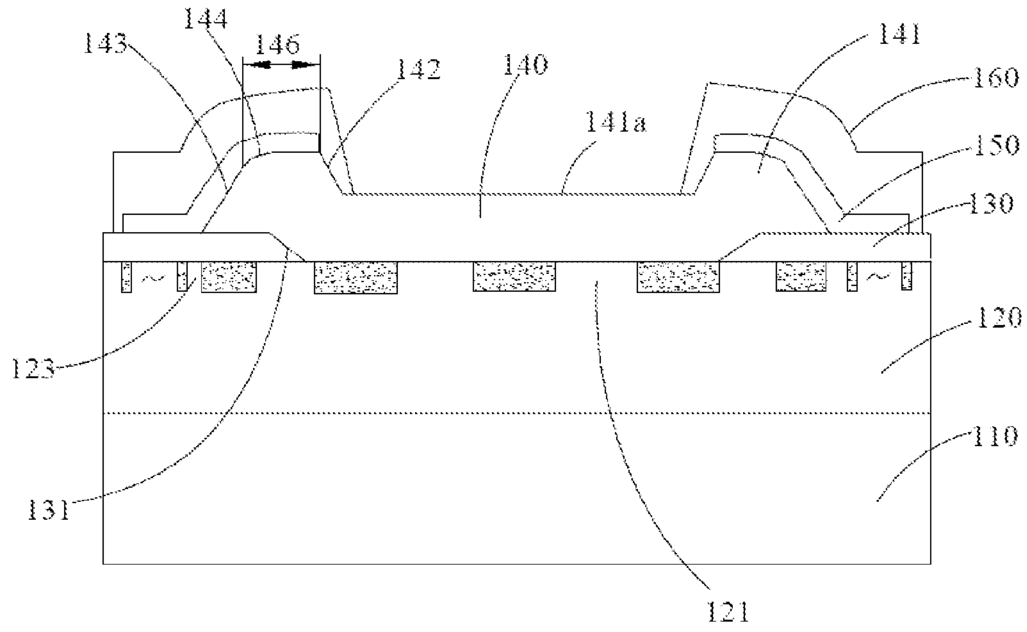
FIG. 3 is a schematic view of a semiconductor structure according to another embodiment of the present disclosure.

In some embodiments, as shown in FIG. 3, the top wall 142 of the anode layer 140 is arranged with a recessed portion 141*a*. An edge of the recessed portion 141*a* is connected to the side wall 143 of the anode layer by a connection portion 146. A section of the connection portion 146 is the connection surface 144.

Furthermore, the field oxide layer 130 is arranged on the semiconductor epitaxial layer 120 and defines a first window 131 exposing the active region 121.

Exemplarily, a protrusion portion 141 is formed on a position of the anode layer 140 corresponding to an edge of the first window 131. The recessed portion 141*a* is formed between two protrusion portions 141 on both sides. The side wall 143 of the anode layer 140 extends from the protrusion portion 141 to the field oxide layer 130. A connection between a surface of the protrusion portion 141 and the side wall 143 of the anode layer 140 is the connection portion 146. The passivation layer 150 covers the side wall 143 and extends to cover the protrusion portion 141.

Figure 4:
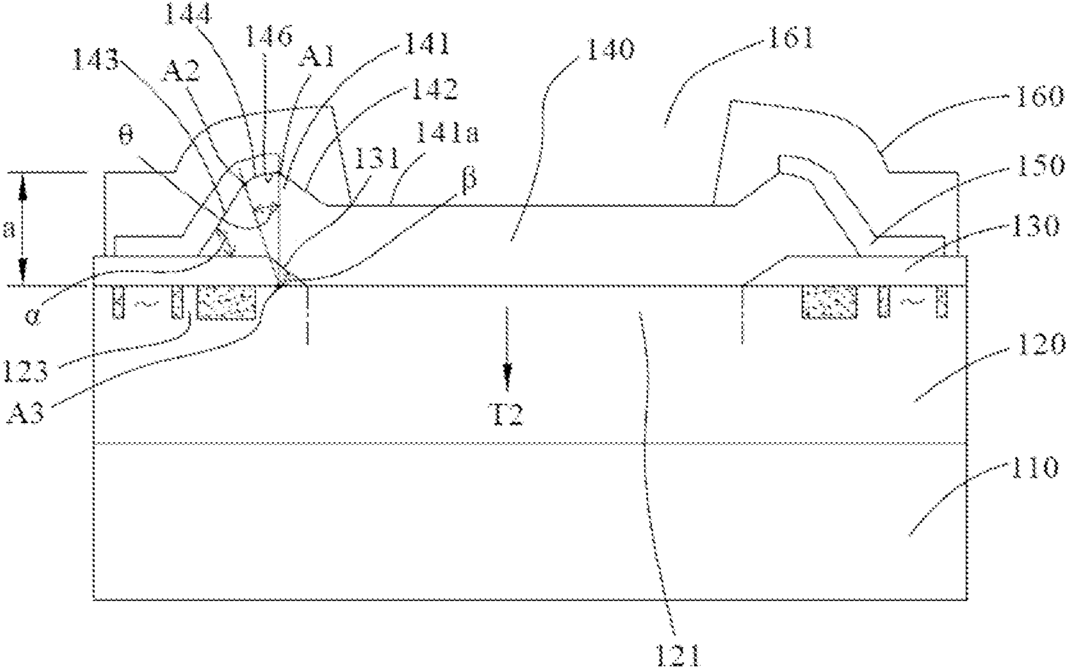
FIG. 4 is a schematic view of a SBD type semiconductor structure according to some embodiments of the present disclosure.

In some embodiments, as shown in FIG. 1 or FIG. 4, the edge of the recessed portion 141*a* is connected to the side wall 143 of the anode layer 140 through the connection portion 146. The connection portion 146 is a connection surface 144 being curved.

Furthermore, in some embodiments, a section of the connection portion 146 is the connection surface 144, and the other section of the connection portion 146 is a part of the top wall 142 of the anode layer 140. That is, the top wall 142 of the anode layer 140 includes: the recessed portion 141*a* and the remaining section of the connection portion 146 other than the connection surface.

In some embodiments, as shown in FIG. 1, FIG. 3, or FIG. 4, the passivation layer 150 covers the side wall 143 of the anode layer 140 and extends to cover the connection portion 146.

In some embodiments, as shown in FIG. 1 or FIG. 3, a length of the part of the passivation layer 150 covering the connection portion is between 2 μm and 100 μm. That is, a connection width of the passivation layer 150 covering the connection portion 146 of the anode layer 140 (i.e., the above-mentioned "length" described above) is in a range from 2 μm to 100 μm. The connection width of the passivation layer 150 covering the connection portion 146 of the anode layer 140 refers to a width of a surface of the connection portion between the passivation layer 150 and the anode layer 140. That is, a width of a part of the surface of the anode layer 140 where the passivation layer 150 is deposited. Further, the connection width is defined based on the width of the surface of the connection. The connection width may also be understood as a length a part of the passivation layer 150 extending from a connection (that is, the connection between the curved connection surface 144 and the sloped and straight side wall 143, as shown in the cross-sectional view) between the connection surface 144 and the side wall 143 to a connection (that is, the connection surface 144) between the connection portion and the top wall 142 that is sloped and straight.

Exemplarily, the connection width of the part of the passivation layer 150 covering the connection portion 146 of the anode layer 140 is 50 μm.

In the above example, the passivation layer 150 covers the connection portion 146 that extends to reach the anode layer 140 and has a certain connection width. In this way, the coverage of the passivation layer 150 may not be excessively wide, such that an excessively large shear force due to inconsistent thermal expansion coefficients of dissimilar materials may be reduced, and therefore, the problem of cracks in the passivation layer 150 caused by the excessively large shear force may be reduced.

To be noted that, in the present embodiment, the protrusion portion 141 is disposed at an edged region of the top wall 142 of the anode layer 140, and the top wall 142 and the side wall 143 of the anode layer 140 are connected with each other through the connection portion 146, the connection portion 146 is curved in overall. That is, as shown in FIG. 1, the connection surface 144 is curved and directly connected to the top wall 142 and the side wall 143. In some embodiments, as shown in FIG. 3, the connection portion 146 may alternatively include a connection surface 144 and a transition surface. The connection surface 144 is curved, and the transition surface is flat. That is, the passivation layer 150 may be transitioned through the curved connection surface and is further smoothed out slightly through the transition surface. In this case, the transition surface is the remaining part of the connection portion 146 other than the connection surface 144, or in other words, the transition surface is a portion of the top wall 142 of the anode layer 140.

The top wall 142 of the anode layer 140 has the recessed portion 141*a*, such that the anode layer 140 has an upper corner and a lower corner. Further, since a section of the connection portion 146 between the edge of the recessed portion 141*a* and the side wall 143 of the anode layer is the curved connection surface 144, the upper corner and the lower corner of the anode layer 140 are transitioned smoothly. That is, the side wall 143 of the anode layer 140 is smoothly transitioned to the top wall. In this way, cracks may not be easily generated at the smooth corners of the passivation layer 150, the moisture resistance of the power element may be improved. In addition, the smooth corners also facilitate the climbing of the passivation layer 150, improving the forming quality of the passivation layer 150.

In addition, the passivation layer 150 extends to cover a top of the protrusion portion 141 and corresponds to the edged region of the first window 131. Specifically, the passivation layer 150 extends from the field oxide layer 130 towards the side wall 143 of the anode layer 140 and continues to climb upwards to reach the top of the protrusion portion 141, such that a good passivation effect may be achieved, and external electrical connection of the anode layer 140 may not be affected. In addition, the passivation layer 150 completely covers the upper corner and the lower corner of the side wall 143 of the anode layer 140. The passivation layer 150 may be a double medium layer of silicon oxide and silicon nitride or may be a silicon oxynitride medium. A thickness of the passivation layer 150 is in a range of 8000 A to 15000 A. Of course, the material and the thickness of the passivation layer 150 is only exemplarily here and is not limited by the present disclosure.

In some embodiments, as shown in FIG. 2, the top wall 142 of the anode layer 140 may be flat (i.e., the recessed portion 141*a* is not included). Specifically, a portion of the anode layer 140 disposed above the active region 121 is flat.

In some embodiments, as shown in FIG. 1 or FIG. 2, the side wall 143 of the anode layer 140 is inclined. An end of the side wall 143 of the anode layer 140 is inclined towards the active region 121, and the other end extends to reach the field oxide layer 130. In detail, the inclined side wall 143 may be understood as: an end of the side wall 143 is arranged on the field oxide layer 130, and the side wall is extending away from the active region and is inclined relative to a plane on which a top surface of the active region is arranged. In detail, an angle between the side wall of the anode layer and the surface of the field oxide layer is a second angle $\alpha$, and the second angle $\alpha$ is a sharp angle, such as an acute angle.

In some embodiments, an angle between the side wall 143 of the anode layer 140 and a surface of the field oxide layer 130 may be less than an angle that is typically required by the advanced integrated circuit applications in the art. For example, the advanced integrated circuit application typically requires a side wall being 88° to 89° vertical. Therefore, in the present embodiment, the angle between the side wall 143 of the anode layer 130 and the surface of the field oxide layer 130 is in a range of 0° to 88°.

In the present embodiment, since the side wall 143 of the anode layer 140 is non-vertical and inclined towards the field oxygen layer 130, the side wall 143 may be smoothly transitioned to the top wall 142 anode layer 140. In this way, a sharp change in the angle (the angle between the side wall 143 and the top wall 142 being excessively large) between the side wall 143 and the top wall 142 of the anode layer 140 may be reduced, the stress concentration at the position of the passivation layer above the transitioned portion may be reduced, and the entry of moisture into the power element, which may result in the failure of the power element, may be reduced.

In some embodiments, an end of the arc (viewed from the cross-sectional view) of the connection surface 144 near the top wall 142 is projected towards the semiconductor epitaxial layer 120, generating a first projection. A side of the field oxide layer 130 away from the semiconductor epitaxial layer 120 has a second projection. The first projection intersects the second projection (a position of the first projection corresponds to a position of the second projection). That is, a projection of an intersection between the arc of the connection surface 144 and the top wall 142 in a direction extending from the semiconductor epitaxial layer 120 towards the substrate 110 falls on the side of the field oxide layer 130 away from the semiconductor epitaxial layer 120.

In some embodiments, the connection surface 144 includes a first point connected to the top wall 142 and a second point connected to the side wall 143. In the direction extending from the semiconductor epitaxial layer 120 towards the substrate 110, a projection point of the first point projected onto the surface of the semiconductor epitaxial layer 120 away from the substrate 110 is a third point. An angle between a line connecting the third point with the second point and a line connecting the third point with the first point is a first angle $\theta$, which is greater than 5°.

It shall be understood that, when the first angle $\theta$ is excessively small, such as less than 5°, the stress concentration of the passivation layer 150 at the corner of the side wall 143 is still significant. Therefore, in order to better solve the stress concentration of the passivation layer 150 at the corner of the side wall 143 and to reduce the cracks at the corner on the side wall 143 caused by the stress concentration of the passivation layer 150, the first angle $\theta$ is set to be as greater than 5°. In this way, the arc of the connection surface being excessively short, which may be caused by the first angle $\theta$ being excessively small, may be solved, such that the stress concentration of the passivation layer corresponding to the corner of the side wall 143 may be reduced better. In this way, the arc of the connection surface being excessively short, which may be caused by the first angle $\theta$ being excessively small, may be solved, cracks in the passivation layer at the corner of the side wall may be reduced. Therefore, the moisture resistance of the power element may be improved, and the stability of the power element may be improved.

In some embodiments, the connection surface 144 includes the first point connected to the top wall 142 and the second point connected to the side wall 143. In the direction extending from the semiconductor epitaxial layer 120 towards the substrate 110, a projection point of the first point projected onto the surface of the field oxide layer 130 is the third point. The angle between the line connecting the third point with the second point and the line connecting the third point with the first point is the first angle $\theta$, which is less than 45°.

It may be understood that, when the first angle $\theta$ is excessively large, such as greater than or equal to 45°, the lower corner of the side wall 143 turning along the arc of the connection surface 144 may be steeper and straighter. In this way, a portion of the passivation layer 150 at the connection between the side wall 143 and the field oxide layer 130 may be steep and straight, such that the passivation layer 150 may be cracked easily at the position where the side wall 143 is connected with the field oxide layer 130. Therefore, in order to reduce the steepness of the passivation layer 150 at the lower corner of the side wall 143, the first angle $\theta$ is set to be as less than 45°. Therefore, the side wall 143 that turns down from arc of the connection surface 144 has a gentle slope. In this way, less stress is concentrated at the passivation layer 150 corresponding to the lower corner of the side wall 143 of the anode layer 140, and cracks may not be generated at the passivation layer 150 corresponding to the lower corner of the side wall 143 of the anode layer 140.

Further, since the first angle $\theta$ is defined to be less than 45°, the side wall 143 that turns down from the arc of the connection surface 144 may have a gentler slope (a tangent extending from the arc towards the slope downwards). In this way, the passivation layer 150 may grow by climbing along the gentle slope, facilitating the passivation layer to grow uniformly.

In order to reduce the stress concentration at the passivation layer 150 corresponding to the upper corner and the lower corner of the side wall 143 and to reduce the cracks caused by the stress concentration at the corners due to the steep and straight anode layer 140 to improve the moisture resistance of the power element, in the present embodiments, the connection surface 144 includes the first point connected to the top wall 142 and the second point connected to the side wall 143. In the direction extending from the semiconductor epitaxial layer 120 towards the substrate 110, a projection point of the first point projected onto the surface of the field oxide layer 130 is the third point. An angle between the line connecting the third point with the second point and the line connecting the third point with the first point is a first angle θ, which is greater than 5° and less than 45°.

Since the first angle θ is greater than 5° and less than 45°, the stress concentration of the passivation layer 150 corresponding to both the upper corner and the lower corner of the side wall 143 of the anode layer 140 may be reduced. In this way, cracks of the passivation layer 150 at the upper corner and the lower corner of the side wall 143 of the anode layer 140 due to the stress concentration may be reduced.

In some embodiments, the first angle θ is in a range from 15° to 30°, such that the stress concentration at the passivation layer 150 corresponding to the upper corner and the lower corner of the side wall 143 may be reduced better, the cracks caused by the stress concentration at the corners due to the anode layer 140 being steep and straight may be reduced, and the moisture resistance of the power element may be improved.

In some embodiments, in a direction T2 from the semiconductor epitaxial layer 120 to the substrate 110, a side of the arc of the connection surface 144 near the top wall 142 has a distance a away from a side of field oxide layer 130 near the semiconductor epitaxial layer 120. To be noted that, ideally, the arc of the connection surface 144 is or close to a part of a right circle, a length L of the arc of the connection surface 144 may be set to be $a*\pi\theta/360$. Of course, in other cases where the arc of the connection surface 144 is not a part of the right circle, the length L of the arc may be calculated by other means, which will not be limited herein.

To be noted that, the distance a is a distance from a first point A1 at which the connection surface 144 is connected with the top wall 142 to a third point A3, which is a projection point of the first point A1 projected onto the semiconductor epitaxial layer 120.

In some embodiments, as shown in FIG. 1 or FIG. 2, the field oxide layer 130 includes a top surface away from the semiconductor epitaxial layer 120, a bottom surface opposite to the top surface and adjacent to the semiconductor epitaxial layer 120, and a side surface connecting with the top surface and the bottom surface. The top surface of the field oxide layer 130 is opposite to the terminal region 123 and is substantially parallel to a surface of the terminal region 123 (i.e., substantially parallel to the top surface of the semiconductor epitaxial layer 120). The side surface of the field oxide layer 130 includes a first side connected to the top surface and a second side connected to the bottom surface. The first side is adjacent to the terminal region 123. In this way, the side surface of the field oxide layer 130 is inclined towards the terminal region 123 in a direction extending from the second side towards the first side.

In some embodiments, the line connecting the first point A1 with the third point A3 may intersect the top surface of the field oxide layer 130. That is, the connection surface 144 of the anode layer entirely lies within the top surface of the field oxide layer 130, such that the stress at the corners of the anode layer 140 may be reduced. Exemplarily, when the anode layer 140 has a uniform thickness, and when the top surface of the field oxide layer 130 is parallel to the surface of the semiconductor epitaxial layer 120, in the direction from the semiconductor epitaxial layer 120 to the substrate 110, a sum of the thickness of the anode layer 140 and the thickness of the field oxide layer 130 may be a, as shown in FIG. 1.

In some embodiments, since the side surface of the field oxide layer 130 is inclined towards the terminal region 123 of the semiconductor epitaxial layer 120, the line connecting the first point A1 with the third point A3 intersects the side surface of the field oxide layer 130. That is, the connection surface 144 of the anode layer 140 is projected onto the semiconductor epitaxial layer 120, generating a first projection; the side surface of the field oxide layer 130 is projected onto the semiconductor epitaxial layer 120, generating a second projection; and the first projection at least partially locates within the second projection, as shown in FIG. 4.

Figure 5:
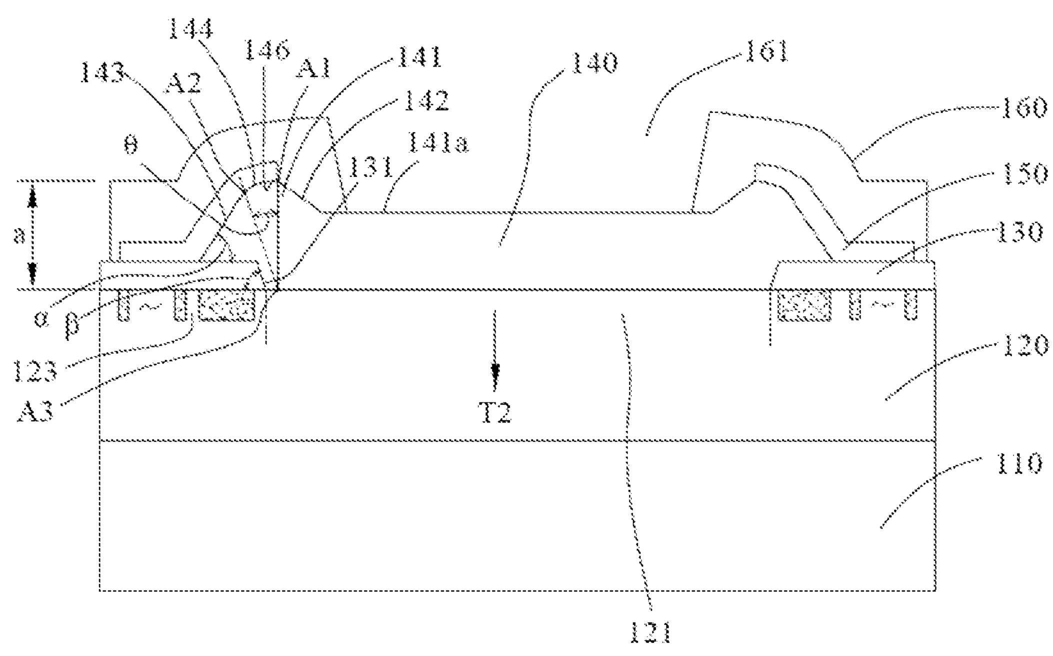
FIG. 5 is schematic view of a SBD type semiconductor structure according to another some embodiments of the present disclosure.

Of course, in some embodiments, the line connecting the first point A1 with the third point A3 does not intersect the field oxide layer 130 at all. That is, the connection surface 144 is projected onto the semiconductor epitaxial layer 120, generating the first projection; the side surface of the field oxide layer 130 is projected onto the semiconductor epitaxial layer 120, generating the second projection; and the first projection completely locates out of the second projection, as shown in FIG. 5.

In some embodiments, an angle between the side wall 143 of the anode layer 140 and the surface of the field oxide layer 130 is a second angle α, being in a range of 30°-60°.

In the present embodiment, conditions for photolithography and etching are optimized, for example, the conditions for photolithography and dry etching are optimized, in this way, the angle between the side wall 143 and the surface of the field oxide layer 130 is between 30°-60°. Since the side wall 143 of the anode layer 140 is inclined towards the active region 121, and since the angle between the side wall 143 and the field oxide layer 130 is between 30° and 60°, the passivation layer 150 may transition smoothly from the side wall 143 to the top wall 142 of the anode layer 140. The sharp change in the angle between the side wall 143 and the top wall 142 of the anode layer 140 may be reduced; the stress concentration at the passivation layer above the connection portion, caused by the sharp change, may be reduced; and failure of the power element caused by the moisture entering the power element may be reduced.

Furthermore, since the side wall 143 of the anode layer 140 is inclined towards the active region 121, and since the angle between the side wall 143 and the surface of the field oxide layer 130 is in the range of 30° and 60°, the passivation layer 150 may better grow along the side wall 143 of the anode layer 140, further optimizing the formation of the passivation layer 150 and optimizing the reliability of the power element.

Exemplarily, the angle between the side wall 143 and the field oxide layer 130 may be 45°.

To be noted that, the angle between the side wall 143 and the surface of the field oxide layer 130 refers to an acute angle between the side wall 143 and the top surface of the field oxide layer 130, i.e., an inclination angle of the side wall 143.

To be noted that the semiconductor structure 100 in the present embodiment refers to a silicon carbide diode structure. That is, the present disclosure provides a highly-reliable silicon carbide diode chip structure. By performing a metal etching method after an angle of the photoresist is optimized, the upper corner of the front metal (i.e., the anode layer) is made to be rounded, and the lower corner is controlled between 30° and 60°. In this way, cracks of the passivation layer due to the stress concentration at the corner caused by the steep and straight side wall of the metal anode layer may be reduced, and the moisture resistance of the power element may be improved.

Further, the upper corner of the front metal (i.e., the anode layer) is made to be rounded, and the lower corner is controlled between 30° and 60°. In this way, a climbing angle of the passivation layer may be reduced, the climbing problem of the passivation layer 150 may be solved, and the reliability of the power element may be improved.

In some embodiments, the connection surface 144 includes a first point connected to the top wall 142 and a second point connected to the side wall 143. In the direction extending from the semiconductor epitaxial layer 120 towards the substrate 110, the projection point of the first point projected onto the surface of the field oxide layer 130 is a third point. An angle between the line connecting the third point with the second point and the line connecting the third point with the first point is a first angle θ, which is greater than 5° and less than 45°. Further, an angle between the side wall 143 of the anode layer 140 and the surface of the field oxide layer 130 is a second angle α, which is between 30° and 60°.

In this way, since the first angle θ is greater than 5° and less than 45°, and since the second angle α is between 30° and 60°, the stress concentration of the passivation layer 150 at both the upper corner and the lower corner of the side wall 143 of the anode layer 140 is reduced, such that the cracks caused by the stress concentration at the passivation layer 150 at both the upper corner and the lower corner of the side wall 143 of the anode layer 140 may be reduced.

In some embodiments, as shown in FIG. 1 or FIG. 2, each of the substrate 110 and the semiconductor epitaxial layer 120 is silicon carbide. A crystalline type of the substrate 110 is 4H—SiC, a thickness of the substrate 110 is in a range of 250 μm-350 μm, and a doping concentration of the substrate 110 is in a range of 1E19-5E20/cm$^3$. A thickness of the silicon carbide epitaxial layer is in a range of 5 μm-40 μm, and a concentration is in a range of 5E15-5E16/cm$^3$.

To be noted that, the substrate 110 may be a material such as silicon (Si), sapphire (Saphhire), and so on. The substrate 110 is configured for heterogeneous to be epitaxially growing to form the semiconductor epitaxial layer 120. A method for depositing the substrate 110 may include chemical vapor deposition (CVD), vapour phase epitaxy (VPE), metal-organic chemical vapor deposition (MOCVD), low pressure chemical vapor deposition (LPCVD), plasma enhanced chemical vapor deposition (PECVD), pulsed laser deposition (PLD), atomic layer epitaxy, molecular beam epitaxy (MBE), sputtering, evaporation, and so on. Of course, the method for depositing the substrate 110 is limited by the present disclosure.

In addition, the semiconductor epitaxial layer 120 may be epitaxially growing by performing chemical vapor deposition (CVD), vapour phase epitaxy (VPE), metal-organic chemical vapor deposition (MOCVD), low pressure chemical vapor deposition (LPCVD), plasma enhanced chemical vapor deposition (PECVD), pulsed laser deposition (PLD), atomic layer epitaxy, molecular beam epitaxy (MBE). Specific structures and forming methods of the substrate 110 and the semiconductor epitaxial layer 120 may be referred to the semiconductor structures 100 in the art.

In some embodiments, as shown in FIG. 1 or FIG. 2, an angle between the side surface of the field oxide layer 130 and the surface of the terminal region 123 is a third angle (3, which is between 30° and 60°. That is, the inclination angle of the side surface of the field oxide layer 130 is between 30° and 60°.

The angle between the side surface of the field oxide layer 130 and the surface of the terminal region 123 refers to the acute angle between the side surface of the field oxide layer 130 and an upper surface of the terminal region 123, i.e., an inclination angle of the side surface of the field oxide layer 130.

In some embodiments, as shown in FIG. 1 or FIG. 2, the anode layer 140 covers the top surface of the field oxide layer 130. Specifically, the anode layer 140 completely covers the first window 131 and partially covers the top surface of the field oxide layer 130.

In some embodiments, as shown in FIG. 1 or FIG. 2, at least partially within the source region 121 is arranged with an injection region (shaded region). The injection region is in contact with the anode layer 140. Specifically, after the semiconductor epitaxial layer 120 is formed, the source region and the terminal region 123 may be formed simultaneously by injecting high energy ions into the semiconductor epitaxial layer 120. The injection region may be a p-doped structure having an injection concentration in a range of 1E17-5E18/cm$^3$. A top view of the injection region within the active region 121 may be, but is not limited to, strip-shaped, square-shaped, hexagon-shaped, or other combinations of structures. The present disclosure does not limit the shape of the injection region.

To be noted that, for the semiconductor device, the anode layer 140 may be in ohmic contact with a P+ region of the active region 121, and the semiconductor device may be a JBS device (junction barrier Schottky diode) or a MPS device (hybrid PIN-Schottky diode), which is in Schottky contact with the N region. In FIG. 1, a surface of the P+ region is connected to a surface of the N region, and the P+ region is an injection region extending from the surface of the N region towards the substrate 110.

In some embodiments, as shown in FIG. 4, the semiconductor device may be an SBD device (Schottky barrier diode), and the metal contact between the anode layer 140 and the active region 121 is the Schottky contact.

Specific structures and principles of the JBS device, the MPS device, and the SBD device may be referred to descriptions in the related art.

To be noted that, the anode layer 140 may be formed by, for example, sputtering or vapour deposition of Schottky metals and front electrode thickening metals. A sputtering temperature is in a range of 400° C.-500° C., and a sputtering time length is in a range of 5-10 min Specific materials of the Schottky metals include, but are not limited to, any one or a combination of metals such as Ti, TiN, TiW, W, Mo, Ta, Ni, and Al. A thickness of the anode layer 140 is in a range of 500 A to 3000 A. Specific materials of the front electrode thickening metal include, but are not limited to, any one or a combination of metals such as Al, Ag, Cu, and so on. Of course, the anode layer 140 may be formed by other means.

To be noted that the anode layer 140 in the present embodiment may be a multilayer structure, and that is, the anode layer 140 includes the Schottky metal and the front electrode thickening metal. Of course, in other embodiments, the anode layer 140 may alternatively be a single layer of metal, such as a copper layer.

In some embodiments, the anode layer 140 is configured to extend from the active region 121 and is disposed on the top surface of the field oxide layer 130.

In some embodiments, the anode layer 140 located on the top surface of the field oxide layer 130 has an extension length L in a first direction T1. That is, the anode layer 140 is configured to extend from the active region 121 and to be disposed on the top surface of the field oxide layer 130. An extension length L of the anode layer 140 in the first direction is in a range of 0-50 μm. The first direction is a direction from the active region 121 to the terminal region 123. Exemplarily, the anode layer 140 is connected to the field oxide layer 130, and the passivation layer 150 is lapped on both the field oxide layer 130 and the anode layer 140.

It will be understood that the extension length L of the anode layer 140 in the first direction may determine a length of the passivation layer 150 lapping over the top surface of the field oxide layer 130. In this way, the anode layer 140 covers a certain area of the field oxide layer 130, such that a risk of directly exposing the active region 121 may be reduced, and the reliability of the power element is improved. In addition, the anode layer 140 covers a certain area of the field oxide layer 130, such that the edge of the anode layer 140 may be spaced apart from the edge of the field oxide layer 130, and therefore, the passivation layer 150 may lap over the top surface of field oxide layer 130, enabling the passivation layer 150 to cover both the field oxide layer 130 and the side wall 143 of the anode layer 140. In this way, the passivation layer 150, when being deposited, may easily climb along the side wall 143 of the anode layer 140, such that the passivation layer 150 may be formed better.

Exemplarily, in the present embodiment, a length of the part of the passivation layer 150 lapping over the top surface of the field oxide layer 130 is 30 μm.

To be noted that in the above embodiment, the thickness of the field oxide layer 130 is in a range from 6000 A to 12000 A. After the field oxide layer 130 is formed, the first window 131 may be formed by performing a wet etching process, and an etching angle is in a range from 30° to 60°. In this way, the side surface of the field oxide layer 130, from a bottom to a top, is inclined towards the terminal region 123. That is, the first window 131 is an inverted trapezoidal structure, and an inclination angle of the edge of the first window 131 is in a range from 30° to 60°.

In some embodiments, the semiconductor structure 100 further includes a protective layer 160. The protective layer 160 is configured to cover the entire passivation layer 150 and extends to cover a portion of the top wall 142 of the anode layer 140.

Exemplarily, the protective layer 160 defines a second window 161 extending to reach the anode layer 140. The anode layer 140 may further be configured to have a pad region extending from the edge of the protective layer 160 to the active region 121. The protective layer 160 may be polyimide. After forming the anode layer 140 and the passivation layer 150, the polyimide may be spin-coated on the passivation layer 150. Baking and exposing may be performed to define the second window 161. The protective layer 160 may completely cover the entire passivation layer 150 and a part of the anode layer 140, and the passivation layer 150 is encased. Moreover, an edge of the second window 161 may be inclined. In this way, the second window 161 may also be an inverted trapezoidal structure. The protective layer 160 has a thickness in a range of 3.5 μm to 12 μm, such that a better protection may be achieved.

The present embodiment further provides a method of manufacturing a semiconductor structure 100. For manufacturing the semiconductor structure 100, the method includes the following operations.

In an operation S1, a substrate structure is provided.

In some embodiments, the substrate structure includes a substrate 110, a semiconductor epitaxial layer 120 disposed on the substrate 110, an active region 121 and a terminal region 123 disposed in the semiconductor epitaxial layer 120. The active region 121 and the terminal region 123 extend from an inside of the semiconductor epitaxial layer 120 towards a surface away from the substrate 110. A field oxide layer 130 is disposed on the semiconductor epitaxial layer 120. The field oxide layer 130 is configured to extend from an edge of the active region 121 towards the terminal region 123.

Exemplarily, the operation S1 may be achieved by performing following operations.

In an operation S11, the substrate 110 is provided.

Figure 6:
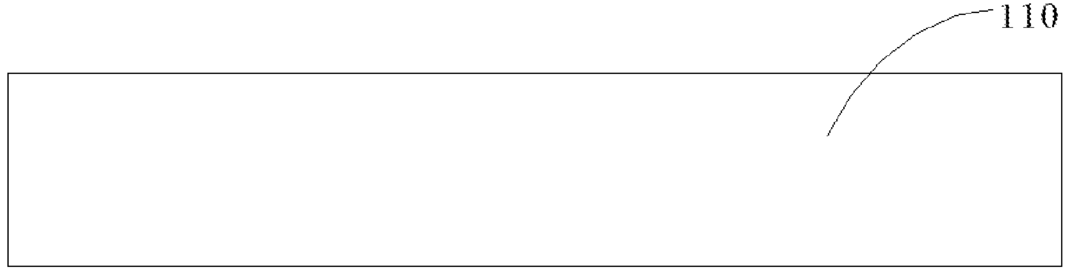
FIG. 6 is a flow chart of a method of manufacturing a semiconductor structure according to an embodiment of the present disclosure.

Exemplarily, as shown in FIG. 6, the substrate 110 may be a silicon carbide substrate 110 for the heterogeneous to be growing epitaxially. A crystalline type of the substrate 110 is 4H—SiC, a thickness of the substrate 110 is in a range of 250 μm-350 μm, and a doping concentration of the substrate 110 is in a range of 1E19-5E20/$cm^3$. A method for depositing the substrate 110 may include chemical vapor deposition (CVD), vapour phase epitaxy (VPE), metal-organic chemical vapor deposition (MOCVD), low pressure chemical vapor deposition (LPCVD), plasma enhanced chemical vapor deposition (PECVD), pulsed laser deposition (PLD), atomic layer epitaxy, molecular beam epitaxy (MBE), sputtering, evaporation, and so on. The substrate 110 may be silicon (Si), sapphire (sapphire), and so on, which will not be limited herein.

In an operation S12, the semiconductor epitaxial layer 120 is formed on the substrate 110.

Figure 7:
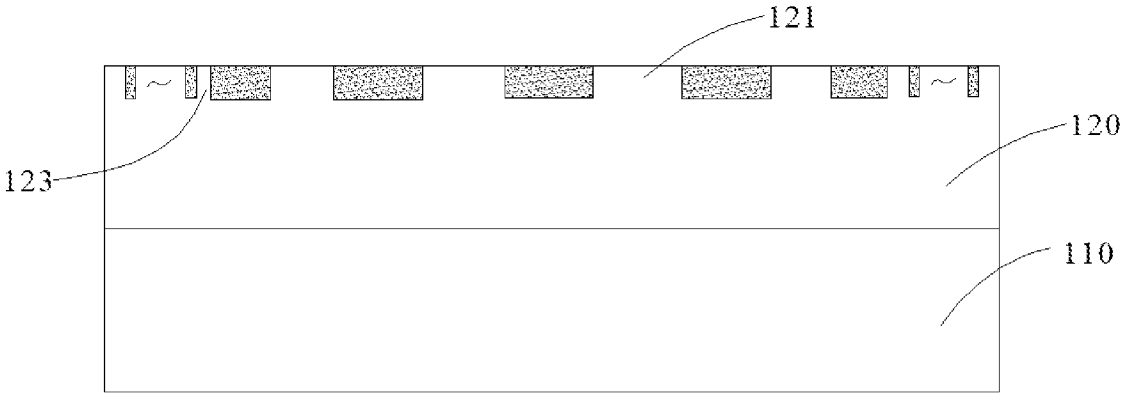
FIG. 7 is another flow chart of a method of manufacturing a semiconductor structure according to an embodiment of the present disclosure.

Exemplarily, as shown in FIG. 7, the semiconductor epitaxial layer 120 may be silicon carbide, and a thickness of the semiconductor epitaxial layer 120 may be in a range of 5 μm-40 μm, and a concentration is in a range of 5E15-5E16/$cm^3$. The semiconductor epitaxial layer 120 may be epitaxially growing on the substrate 110 by performing chemical vapor deposition (CVD), vapour phase epitaxy (VPE), metal-organic chemical vapor deposition (MOCVD), low pressure chemical vapor deposition (LPCVD), plasma enhanced chemical vapor deposition (PECVD), pulsed laser deposition (PLD), atomic layer epitaxy, molecular beam epitaxy (MBE).

To be noted that, epitaxy of the silicon carbide substrate 110 is a basic manufacturing process, the silicon carbide substrate 110 and the silicon carbide epitaxy may be obtained by performing the operations S11 and S12. After the semiconductor epitaxial layer 120 is formed, the active region 121 and the terminal region 123 may be formed by performing injections into the semiconductor epitaxial layer 120. The active region 121 and the terminal region 123 extend from the inside of the semiconductor epitaxial layer 120 towards the surface away from the substrate 110. Specifically, the p-doped injection region of the active region 121 and the terminal region 123 may be formed simultaneously by injecting high energy ions. A concentration of the injection is in a range of 1E17-5E18/$cm^3$. The injection region within the active region 121 may be, but not limited to, strip-shaped, square-shaped, hexagon-shaped or other combination of structures.

In an operation S13, the field oxide layer 130 is formed on the semiconductor epitaxial layer 120.

Figure 8:
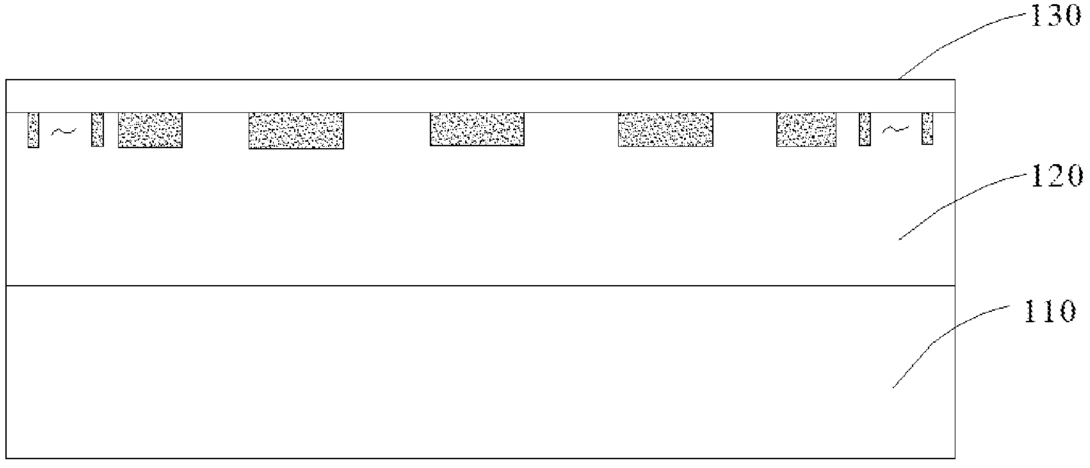
FIG. 8 is another flow chart of a method of manufacturing a semiconductor structure according to an embodiment of the present disclosure.

Exemplarily, as shown in FIG. 8, the field oxide layer 130 may be formed on the semiconductor epitaxial layer 120 by performing CVD, and a thickness of the field oxide layer 130 is in a range from 6000 A to 12000 A.

In an operation S14, the field oxide layer 130 may be etched to form a first window 131 exposing the active region 121.

Figure 9:
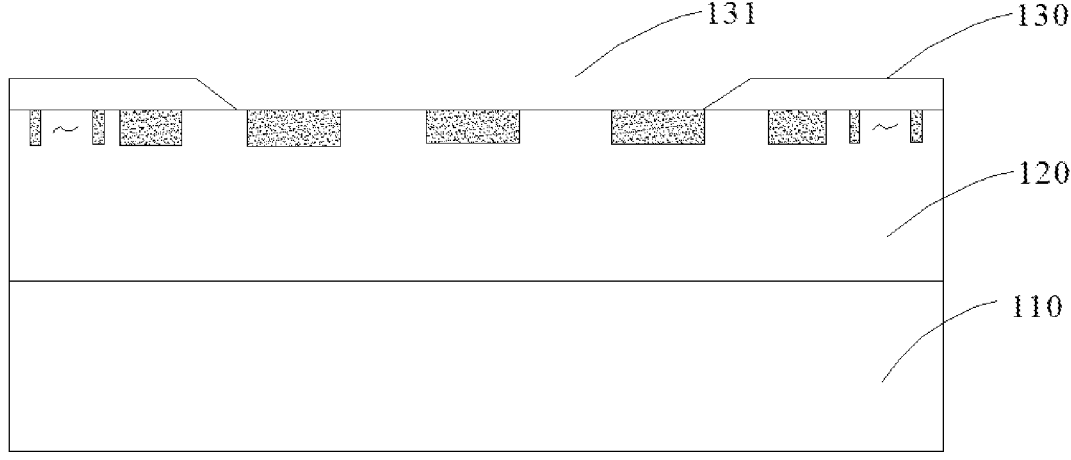
FIG. 9 is another flow chart of a method of manufacturing a semiconductor structure according to an embodiment of the present disclosure.

Exemplarily, as shown in FIG. 9, the first window 131 extends to reach the semiconductor epitaxial layer 120 and may be formed by performing a wet etching process. An etching angle is in a range of 30°-60°. In this way, the first window 131 may be an inverted trapezoidal structure, and an inclination angle of an edge of the first window 131 may be in a range of 30° and 60°. While performing the manufacturing in practice, the wet etching process is performed to offset an etching angle of 30°-60° in the terminal region to achieve etching on the field oxide layer 130 on the active region 121. In this way, the first window 131 exposing the active region 121 may be formed by the side surface of the field oxide layer 130 being inclined at the angle of 30°-60° with respect to the surface of the terminal region.

In an operation S2, an anode layer 140 is formed on the field oxide layer 130 and the active region 121.

Figure 10:
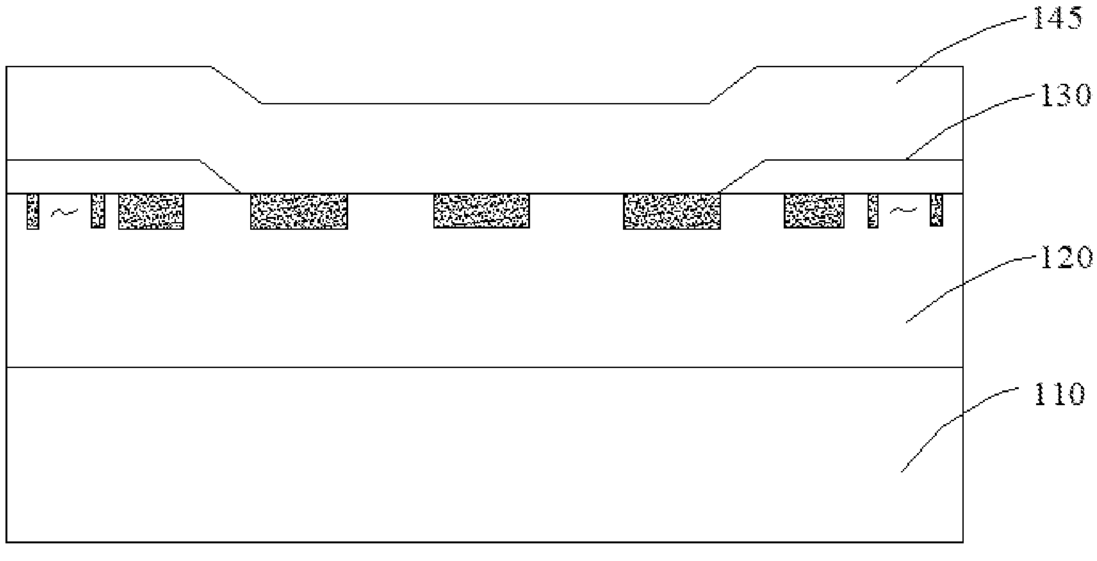
FIG. 10 is another flow chart of a method of manufacturing a semiconductor structure according to an embodiment of the present disclosure.
Figure 11:
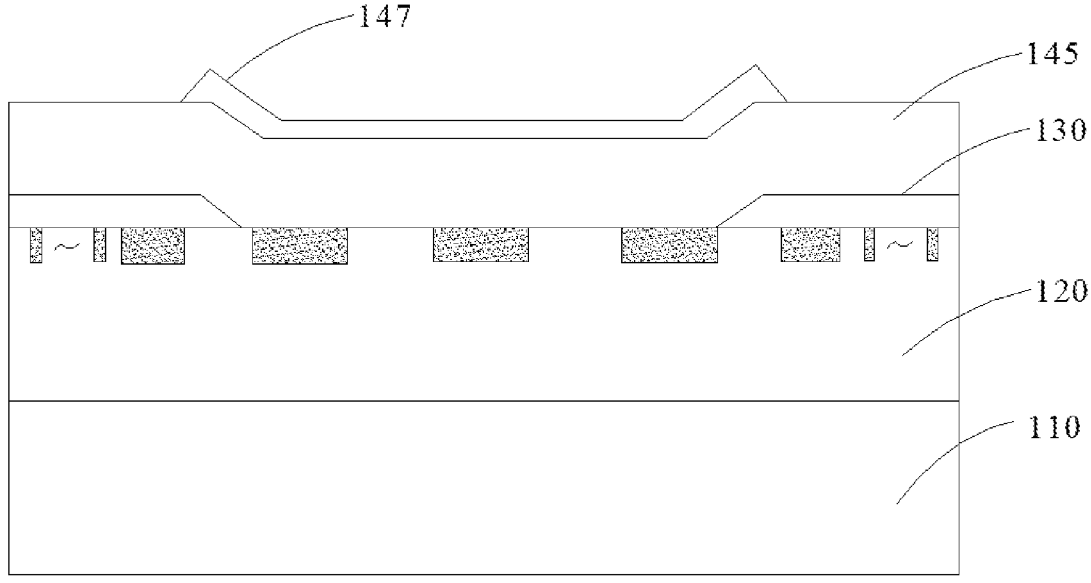
FIG. 11 is another flow chart of a method of manufacturing a semiconductor structure according to an embodiment of the present disclosure.
Figure 12:
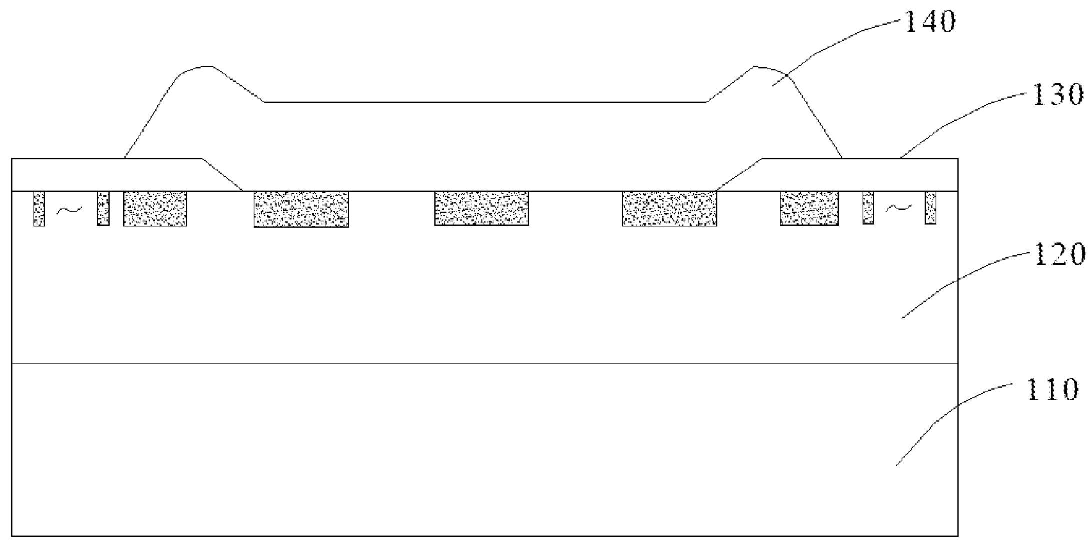
FIG. 12 is another flow chart of a method of manufacturing a semiconductor structure according to an embodiment of the present disclosure.

In some embodiments, as shown in FIG. 10 to FIG. 12, the anode layer 140 is configured to be extending from the active region 121 to cover a portion of the field oxide layer 130. The anode layer 140 includes: a top wall 142 away from the active region 121, a side wall 143 facing the field oxide layer 130 and connected to the field oxide layer 130. The side wall 143 of the anode layer 140 is connected to the top wall 142 of the anode layer through a connection surface 144. The connection surface 144 is curved to allow the side wall 143 to be transitioned smoothly to the top wall 142 of the anode layer 140.

In some embodiments, while manufacturing the anode layer 140, the anode layer 140 having a recessed portion may be formed on the active region 121 and the field oxide layer 130. The recessed portion may be arranged on the top wall 142 of the anode layer 140. An edge of the recessed portion may be connected to the side wall of the anode layer 140 through a connection portion. At least a section of the connection portion is the connection surface 144.

While manufacturing the device in practice, a metal layer 145 may be formed on the field oxide layer 130 and the semiconductor epitaxial layer 120 by sputtering or vapour depositing, as shown in FIG. 10. Further, a photoresist material is coated on the metal layer 145. The photoresist material is inclined towards the active region 121 at a predetermined angle and is then exposed and developed, such that a photoresist layer 147 is formed. The predetermined angle is in a range from 30° to 60°, such that the edge of the photoresist layer 147 is inclined at the angle in the range from 30° to 60°, as shown in FIG. 11. Finally, the photoresist layer 147 serves as a mask, the metal layer 145 is then etched to form the anode layer 140 having a curved connecting surface 144, as in FIG. 12. The photoresist layer 147 is prepared in advance to enable the anode layer 140 to be etched to form a metallic profile having curvature. The upper corner of the side wall 143 of the anode layer 140 is rounded, and the lower corner is inclined at the angle of in the range from 30° to 60°. Further, the edge of the anode layer 140 needs to lap over the field oxide layer 130, and a distance between the edge of the anode layer 140 and the edge of the passivation layer 150 (as shown in FIG. 12) is in a range from 0 to 50 μm.

Exemplarily, while the metal layer 145 is being etched, such as being dry etched, the etching may be performed along the edge of the photoresist layer 147 to form a side wall of the anode layer having an angle between 30° and 60° with respect to the surface of the field oxide layer 130. Specifically, the etching may be performed along the edge of the photoresist layer 147 to form the anode layer 140 extending from the active region 121 to be disposed on the top surface of the field oxide layer 130, and an extending length of the anode layer 140 is in a range from 0 to 50 μm. The first direction T2 is the direction extending from the active region 121 to the terminal region 123.

In some embodiments, after anode layer 140 is formed after the etching, the photoresist layer 147 may be removed. Further, a protrusion portion 141 is formed on the anode layer 140 corresponding to the edge of the first window 131. The protrusion portion 141 may define the recessed portion. The side wall 143 of the anode layer 140 extends from the protrusion portion 141 to the field oxide layer 130. A connection portion between the surface of the protrusion portion 141 and the side wall 143 of the anode layer 140 is curved.

In an operation S3, a passivation layer 150 is formed on the field oxide layer 130 and the anode layer 140.

Figure 13:
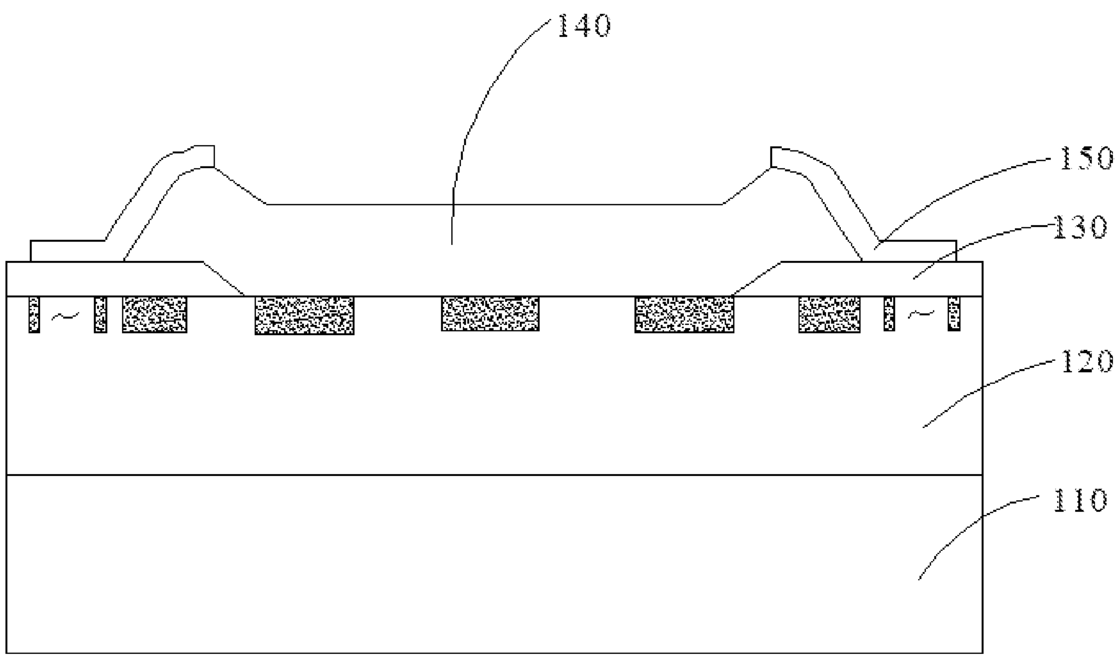
FIG. 13 is another flow chart of a method of manufacturing a semiconductor structure according to an embodiment of the present disclosure.

Exemplarily, as shown in FIG. 13, the passivation layer 150 is configured to cover the field oxide layer 130 and extends to cover a part of the top wall 142 of the anode layer 140. While manufacturing the device, a high resistance material layer is deposited on the field oxide layer 130 and on the anode layer 140. Further, the high resistance material layer is etched to cover on the side wall of the anode layer 140 and to extend to cover the connection surface 144. The etched high resistance material layer serves as the passivation layer 150.

In practice, the passivation layer 150 is deposited by performing CVD. The passivation layer 150 covers the side wall 143 and extends to cover the protrusion portion 141. The passivation layer 150 may be a double layer medium having silicon oxide and silicon nitride or a silicon nitride medium. A thickness of the passivation layer 150 may be in a range from 8000 A to 15000 A.

To be noted that when depositing the passivation layer 150, a width of the passivation layer 150 covering the connection surface 144 of the anode layer 140 shall not be excessively large. For example, a connection width of the passivation layer 150 covering the connection surface of the anode layer 140 is in a range from 2 μm to 100 μm, preventing the passivation layer 150 from having an excessively large coverage. In this way, cracks, which are caused by excessive shear forces due to inconsistent thermal expansion coefficients, may be prevented from being generated on the passivation layer 150. Of course, in some embodiments where the connection portion 146 includes a connection surface 144 and a transition surface, as shown in FIG. 3, the connection width of the passivation layer 150 covering the connection portion 146 of the anode layer 140 shall not be excessively large, which is in a range from 2 μm to 100 μm.

In an operation S4, a protective layer 160 is formed on the passivation layer 150.

Exemplarily, as shown in FIG. 1, the protective layer 160 covers the passivation layer 150 and the anode layer 140. The protective layer 160 may be formed by spin-coating polyimide material on the passivation layer 150, exposure baking the polyimide material, and performing shaping. Further, a second window 161 is defined in the protective layer 160, and a thickness of the protective layer 160 is in a range from 3.5 μm to 12 μm.

In summary, the present embodiment provides a semiconductor structure 100. The first window 131 is formed in the field oxide layer 130, and the anode layer 140 is formed to cover the first window 131. In this way, the protrusion portion 141 is formed on the anode layer 140 corresponding to the edge of the first window 131. The side wall 143 of the anode layer 140 extends from the protrusion portion 141 to the field oxide layer 130. The connection portion between the surface of the protrusion portion 141 and the side wall 143 of the anode layer 140 is curved. The passivation layer 150 covers the side wall 143 of the anode layer 140 and extends to cover the protrusion portion 141. By arranging the upper corner of the side wall 143 of the anode layer 140, i.e., the connection portion between the side wall 143 and the protrusion portion 141, to be curved, the side wall 143 may be transitioned smoothly to the protrusion portion 141 of the anode layer 140, preventing a sharp change in the inclination angle, such that the stress concentration of the passivation layer 150 at the corner on the side wall 143 may be prevented. Compared to the related art, for the semiconductor structure 100 of the present embodiment, cracks caused by stress concentration at the corners due to the steep and straight metal layer 145 may be reduced, and the moisture resistance of the power element may be improved.

In addition, by reasonably defining the width of the passivation layer 150, the coverage of the passivation layer 150 may not be excessively broad, such that cracks, which are caused by excessive shear forces due to inconsistent thermal expansion coefficients, may be prevented from being generated on the passivation layer 150.

In addition, since the side wall 143 is transitioned smoothly to the top wall, the passivation layer 150 may be facilitated to extend upwardly when depositing the passivation layer 150, such that climbing of the passivation layer 150 may be achieved better, a better forming quality of the passivation layer 150 may be achieved, and reliability of the power element may be improved. Climbing of the passivation layer 150 may be optimized, the forming quality of the passivation layer 150 may be improved.

To be noted that with respect to the method in the above embodiments, the beneficial effects and benefits of each of these embodiments have been described in detail in the structural embodiments and will not be described in detail here.

The above are only specific embodiments of the present disclosure, but the scope of the present disclosure is not limited to the above embodiments. Any variations or substitutions that can be made of by ordinary skilled person in the art, within the technical scope disclosed by the present invention, shall be covered by the scope of the present invention. Therefore, the scope of the present invention shall be governed by the scope of the claims.

What is claimed is:

1. A semiconductor structure, comprising:

a substrate;

a semiconductor epitaxial layer, disposed on the substrate;

an active region and a terminal region, provided in the semiconductor epitaxial layer;

a field oxide layer, arranged on the semiconductor epitaxial layer and extending from an edge of the active region towards the terminal region;

an anode layer, configured to extend from the active region to be arranged on a portion of the field oxide layer, wherein the anode layer comprises: a top wall, away from the active region; a side wall, connected to the field oxide layer; and a connection surface, connected between the side wall of the anode layer and the top wall of the anode layer; the connection surface is curved and outwardly convex toward a direction away from the substrate, a transition between the side wall and the top wall of the anode layer is smooth; and a passivation layer, configured to cover the field oxide layer and extend along the side wall and to cover at least the connection surface;

wherein the side wall of the anode layer is inclined towards the active region, and the side wall of the anode layer has an inclination shape.

2. The semiconductor structure according to claim 1, wherein an angle between the side wall of the anode layer and the surface of the field oxide layer is a second angle $\alpha$, and the second angle $\alpha$ is a sharp angle.

3. The semiconductor structure according to claim 2, wherein the connection surface comprises a first point connected to the top wall and a second point connected to the side wall; in a direction from the semiconductor epitaxial layer towards the substrate, a projection point of the first point projected onto a surface of the semiconductor epitaxial layer is defined as a third point; and an angle between a line connecting the third point with the second point and a line connecting the third point with the first point is a first angle $\theta$, and the first angle $\theta$ is greater than 5°.

4. The semiconductor structure according to claim 3, wherein the first angle $\theta$ is less than 45°.

5. The semiconductor structure according to claim 4, wherein the first angle $\theta$ is in a range of 15° to 30°.

6. The semiconductor structure according to claim 2, wherein the second angle $\alpha$ is in a range from 30° to 60°.

7. The semiconductor structure according to claim 1, wherein the field oxide layer comprises: a top surface, away from the terminal region, and a side surface, connected to the top surface and arranged from the top surface towards the active region, wherein the top surface of the field oxide layer is parallel to a surface of the terminal region.

8. The semiconductor structure according to claim 7, wherein the anode layer covers at least a portion of the top surface of the field oxide layer.

9. The semiconductor structure according to claim 7, wherein the anode layer that covers the top surface of the field oxide layer has an extension length in a first direction, the extension length is in a range from 0 to 50 μm, the first direction is defined as a direction extending from the active region to the terminal region.

10. The semiconductor structure according to claim 7, wherein an angle between the side surface of the field oxide layer and a surface of the terminal region is a third angle $\beta$, and the third angle $\beta$ is in a range from 30° to 60°.

11. The semiconductor structure according to claim 1, wherein the top wall of the anode layer has a recessed portion, an edge of the recessed portion is connected to the side wall of the anode layer through a connection portion, and at least a part of the connection portion is the connection surface.

12. The semiconductor structure according to claim 11, wherein the connection portion is the connection surface.

13. The semiconductor structure according to claim 11, wherein the connection portion comprises the connection surface a part of the top wall, the passivation layer covers the side wall of the anode layer and extends to cover the connection portion.

14. The semiconductor structure according to claim 13, wherein a length of a part of the passivation layer that covers the connection portion is in a range from 2 μm to 100 μm.

15. The semiconductor structure according to claim 1, wherein further comprising a protective layer, wherein the protective layer is configured to cover the entire passivation layer and extends to cover a portion of the top wall of the anode layer.

16. A method of manufacturing a semiconductor structure, comprising:

providing a substrate structure, wherein the substrate structure comprises: a substrate; a semiconductor epitaxial layer, disposed on the substrate; an active region and a terminal region, disposed in the semiconductor epitaxial layer; and a field oxide layer, configured to extend from an edge of the active region towards the terminal region;

forming an anode layer on the field oxide layer and the active region, wherein the anode layer is configured to be extending from the active region to cover a portion of the field oxide layer; the anode layer comprises: a top wall, away from the active region; a side wall, connected to the field oxide layer; and a connection surface, connecting between the side wall and the top wall of the anode layer; the connection surface is curved and outwardly convex toward a direction away from the substrate to allow the side wall to be transitioned smoothly to the top wall of the anode layer; and forming a passivation layer on the field oxide layer and the anode layer, wherein the passivation layer is configured to cover the field oxide layer and extends along the side wall to cover at least the connection surface;

wherein the side wall of the anode layer is inclined towards the active region, and the side wall of the anode layer has an inclination shape.

17. The method according to claim 16, wherein the providing a substrate structure, comprises:

forming the semiconductor epitaxial layer on the substrate;

performing injection to form the active region and the terminal region in in the semiconductor epitaxial layer, wherein the active region and the terminal region extend from an inside of the semiconductor epitaxial layer towards a surface away from the substrate;

forming the field oxide layer on the semiconductor epitaxial layer; and etching the field oxide layer to form a first window exposing the active region.

18. The method according to claim 16, wherein the forming an anode layer on the field oxide layer and the active region, comprises:

forming a metal layer on the field oxide layer and the semiconductor epitaxial layer;

coating a photoresist material on the metal layer;

inclining the photoresist material towards the active region at a predetermined angle, exposing and developing the photoresist material to form a photoresist layer, wherein the photoresist layer is inclined towards the active region at the predetermined angle; and etching the metal layer to form the anode layer.

19. The method according to claim 18, wherein the predetermined angle is in a range from 30° to 60°, and the etching the metal layer to form the anode layer, comprises:

performing the etching along an edge of the photoresist layer to form a side wall of the anode layer having an angle between 30° and 60° with respect to a surface of the field oxide layer.

20. The method according to claim 18, wherein the etching the metal layer to form the anode layer, comprises:

etching the photoresist layer along an edge of the photoresist layer to form the anode layer, wherein the anode layer extends from the active region to cover the top surface of the field oxide layer, an extension length of the anode layer is in a range from 0 to 50 μm in a first direction, and the first direction is defined as a direction extending from the active region to the terminal region.

* * * * *